United States Patent
Yu et al.

(10) Patent No.: US 12,293,698 B2
(45) Date of Patent: May 6, 2025

(54) METHOD FOR DRIVING LIGHT-EMITTING SUBSTRATE WITH LIGHT-EMITTING SUB-REGIONS, DRIVING CIRCUIT AND DISPLAY APPARATUS

(71) Applicants: Fuzhou BOE Optoelectronics Technology Co., Ltd., Fujian (CN); BOE Technology Group Co., Ltd., Beijing (CN)

(72) Inventors: Renhui Yu, Beijing (CN); Xiaoyang Liu, Beijing (CN); Hongzhou Xie, Beijing (CN); Xin Chen, Beijing (CN); Meizhen Chen, Beijing (CN); Yi Zheng, Beijing (CN); Zhiliang Zheng, Beijing (CN); Ying Tian, Beijing (CN); Chengwei Shi, Beijing (CN); Shulian Lin, Beijing (CN); Qingna Hou, Beijing (CN); Kai Diao, Beijing (CN); Liangliang Ren, Beijing (CN)

(73) Assignees: Fuzhou BOE Optoelectronics Technology Co., Ltd., Fujian (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/021,547

(22) PCT Filed: Apr. 26, 2022

(86) PCT No.: PCT/CN2022/089317
§ 371 (c)(1),
(2) Date: Feb. 15, 2023

(87) PCT Pub. No.: WO2023/206078
PCT Pub. Date: Nov. 2, 2023

(65) Prior Publication Data
US 2024/0265846 A1    Aug. 8, 2024

(51) Int. Cl.
*G09G 3/32*    (2016.01)
*H01L 25/075*  (2006.01)
*H01L 33/62*   (2010.01)

(52) U.S. Cl.
CPC ........... *G09G 3/32* (2013.01); *H01L 25/0753* (2013.01); *H01L 33/62* (2013.01);
(Continued)

(58) Field of Classification Search
CPC ................ G09G 3/32; G09G 2310/08; G09G 2320/0233; G09G 2330/025; G09G 2330/06; H01L 25/0753; H01L 33/62
See application file for complete search history.

(56) References Cited

U.S. PATENT DOCUMENTS

2009/0146943 A1    6/2009   Kim et al.
2012/0074856 A1*   3/2012   Takata ................... H05B 45/38
                                                         315/192

(Continued)

FOREIGN PATENT DOCUMENTS

CN    105513545 A    4/2016
CN    109493811 A    3/2019
(Continued)

*Primary Examiner* — Rodney Amadiz
(74) *Attorney, Agent, or Firm* — IPro, PLLC

(57) ABSTRACT

Provided are a method for driving a light-emitting substrate, a driving circuit and a display apparatus. The light-emitting substrate includes: at least one control region, which includes a plurality of light-emitting sub-regions, the light-emitting sub-region includes a plurality of light-emitting elements which are connected in series and/or in parallel; each light-emitting sub-regions includes a first signal end and a second signal end, in a same control region, the first signal ends of all the light-emitting sub-regions are electrically connected with each other, and the second signal ends of the different light-emitting sub-regions are independent of each other; the method includes: loading a first signal to the (Continued)

first signal ends in the control region; and loading second signals to the second signal ends of each of the plurality of the light-emitting sub-regions in the control region when a first duration is delayed after the first signal is provided.

20 Claims, 9 Drawing Sheets

(52) U.S. Cl.
CPC . *G09G 2310/08* (2013.01); *G09G 2320/0233* (2013.01); *G09G 2330/025* (2013.01); *G09G 2330/06* (2013.01)

(56) References Cited

U.S. PATENT DOCUMENTS

| | | | |
|---|---|---|---|
| 2019/0371254 A1* | 12/2019 | Tian | G09G 3/3426 |
| 2020/0380923 A1* | 12/2020 | Sun | H05B 45/52 |
| 2022/0053615 A1 | 2/2022 | Hao et al. | |
| 2022/0130892 A1* | 4/2022 | Dong | H01L 27/156 |
| 2023/0143518 A1 | 5/2023 | Li | |

FOREIGN PATENT DOCUMENTS

| | | | |
|---|---|---|---|
| CN | 110969976 A | 4/2020 | |
| CN | 111812888 A | 10/2020 | |
| CN | 113077762 A | 7/2021 | |
| CN | 113614625 A | 11/2021 | |
| CN | 114220398 A | 3/2022 | |
| JP | 2002196721 A | 7/2002 | |

* cited by examiner

METHOD FOR DRIVING LIGHT-EMITTING SUBSTRATE WITH LIGHT-EMITTING SUB-REGIONS, DRIVING CIRCUIT AND DISPLAY APPARATUS

CROSS REFERENCE TO RELATED APPLICATIONS

The present disclosure is a National Stage of International Application No. PCT/CN2022/089317, filed Apr. 26, 2022.

FIELD

The present disclosure relates to the technical field of semiconductors, in particular to a method for driving a light-emitting substrate, a driving circuit and a display apparatus.

BACKGROUND

In recent years, display apparatuses with an ultra-high contrast ratio (>20000) and ultra-high brightness (peak brightness 1000/1400 nit) have become the development trend of the display industry, leading to the high popularity of light-emitting diodes (for example, mini LEDs), and various display panel manufacturers have invested research and development resources, which speeds up the process of light-emitting diode productization.

SUMMARY

Embodiments of the present disclosure provide a method for driving a light-emitting substrate, a driving circuit and a display apparatus.

An embodiment of the present disclosure further provides a method for driving the light-emitting substrate, the light-emitting substrate includes: at least one control region, the at least one control region includes a plurality of light-emitting sub-regions, and the at least one of the plurality of light-emitting sub-regions includes a plurality of light-emitting elements which are connected in series and/or in parallel; each of the plurality of light-emitting sub-regions includes a first signal end and a second signal end, in a same control region, the first signal ends of all the light-emitting sub-regions are electrically connected with each other, and the second signal ends of the different light-emitting sub-regions are independent of each other; where the method includes: loading a first signal to the first signal ends in the control region; and loading second signals to the second signal ends of each of the plurality of the light-emitting sub-regions in the control region when a first duration is delayed after the first signal is provided.

In some embodiments, the loading the second signals to the second signal ends of each of the plurality of the light-emitting sub-regions in the control region, includes: loading the second signals to the second signal ends of each of the light-emitting sub-regions in the control region in sequence, enable to the second signals of adjacent light-emitting sub-regions to be delayed in sequence.

In some embodiments, delay durations of the second signals of any adjacent light-emitting sub-regions are equal.

In some embodiments, the loading the second signals to the second signal ends of each of the light-emitting sub-regions in the control region in sequence, includes: loading, during a loading period of the first signals, the second signals to the second signal ends of each of the light-emitting sub-regions in the control region in sequence.

In some embodiments, the loading the second signals to the second signal ends of each of the light-emitting sub-regions in the control region in sequence, includes: loading the second signals to the second signal ends of each of the light-emitting sub-regions in the control region simultaneously.

In some embodiments, the loading the first signal to the first signal ends in the control region, includes: loading the first signal to the first signal ends in the control region, when a second duration is delayed after a synchronization signal is provided.

In some embodiments, the loading the first signal to the first signal ends in the control region, includes: loading the first signal to the first signal ends in the control region at a driving frequency of 15 MHZ to 25 MHZ.

In some embodiments, the method further includes: providing third signal to first signal ends of a next control region when it is determined that the first signal of the first signal ends of the current control region is turn off.

An embodiment of the present disclosure further provides a driving circuit, including: a first module, configured to load a first signal to the first signal ends in the control region; and a second module, configured to load second signals to the second signal ends of each of the plurality of the light-emitting sub-regions in the control region when a first duration is delayed after the first signal is provided.

In some embodiments, the first module is further configured to load the second signals to the second signal ends of each of the light-emitting sub-regions in the control region in sequence, enable to the second signals of adjacent light-emitting sub-regions to be delayed in sequence.

In some embodiments, the first module is further configured to load the second signals to the second signal ends of each of the light-emitting sub-regions in the control region simultaneously.

In some embodiments, the first module is further configured to load the first signal to the first signal ends in the control region, when a second duration is delayed after a synchronization signal is provided.

In some embodiments, the first module is further configured to load the first signal to the first signal ends in the control region at a driving frequency of 15 MHZ to 25 MHZ.

In some embodiments, the driving circuit further includes a third module, and t the third module is configured to provide third signal to first signal ends of a next control region when it is determined that the first signal of the first signal ends of the current control region is turn off.

An embodiment of the present disclosure further provides a display apparatus, including the at least one driving circuit provided by the embodiment of the present disclosure and a light-emitting substrate, the light-emitting substrate includes: at least one control region, the at least one control region includes a plurality of light-emitting sub-regions, and the at least one of the plurality of light-emitting sub-regions includes a plurality of light-emitting elements which are connected in series and/or in parallel; each of the plurality of light-emitting sub-regions includes a first signal end and a second signal end, in a same control region, the first signal ends of all the light-emitting sub-regions are electrically connected with each other, and the second signal ends of the different light-emitting sub-regions are independent of each other.

In some embodiments, the driving circuit is a light-emitting control chip.

DETAILED DESCRIPTION OF THE EMBODIMENTS

Figure 1:
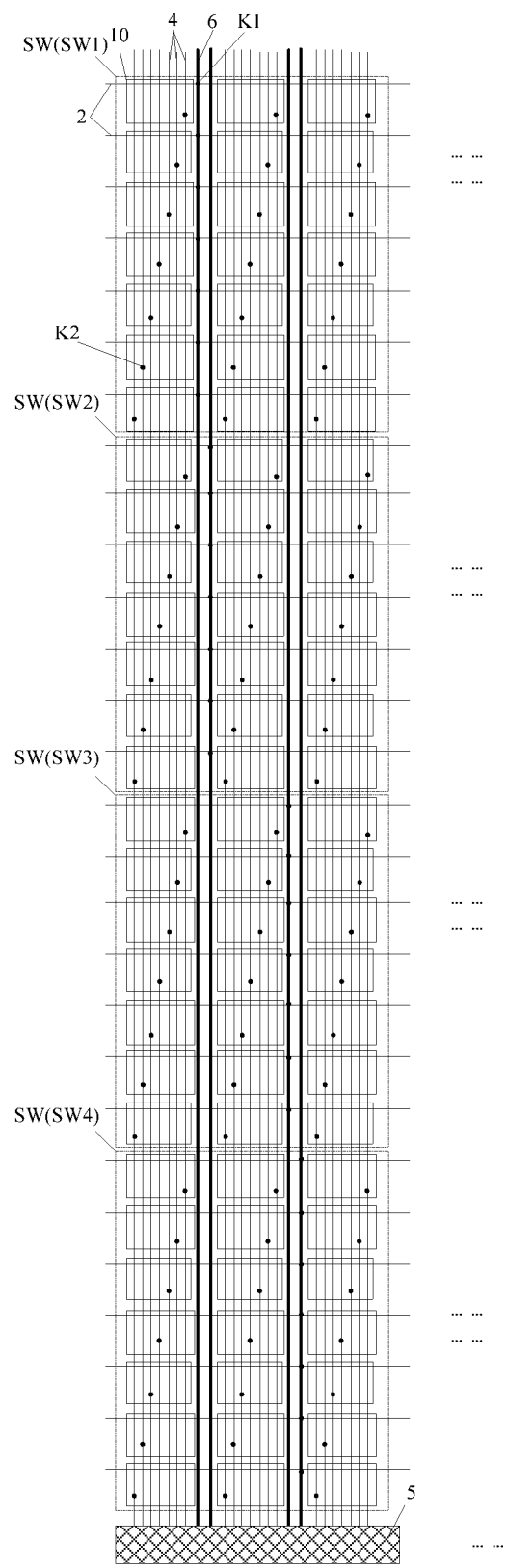
FIG. 1 is a partial schematic structural diagram of a display apparatus.

In order to make objectives, technical solutions and advantages of the embodiments of the present disclosure clearer, the technical solutions of the embodiments of the present disclosure will be clearly and completely described below with reference to the accompanying drawings of the embodiments of the present disclosure. Obviously, the described embodiments are some, but not all, embodiments of the present disclosure. Based on the described embodiments in the present disclosure, all other embodiments acquired by those of ordinary skill in the art without creative work shall fall within the protection scope of the present disclosure.

Unless otherwise defined, technical or scientific terms used herein should have the ordinary meaning as understood by those of ordinary skill in the art to which the present disclosure belongs. "First", "second" and similar words used in the present disclosure do not represent any order, quantity or importance, and are merely used to distinguish different constituent parts. "Comprise" or "include" and similar words mean that the elements or objects appearing before the words cover the elements or objects recited after the words and their equivalents, but do not exclude other elements or objects. Similar words such as "connect" or "link" are not limited to physical or mechanical connection, but may include electrical connection, whether direct or indirect. "Up", "down", "left", "right" and the like are merely used to represent a relative position relationship, and after an absolute position of a described object is changed, the relative position relationship may also be changed accordingly.

In order to keep the following descriptions of the embodiments of the present disclosure clear and concise, detailed descriptions of known functions and known components are omitted in the present disclosure.

In driving of mini light-emitting diodes, due to high power consumption of lamp panels, taking more than 1000 sub-regions as an example, peak design power of the lamp panels will reach more than 100 W, in high power driving, constant change of signals is further involved, a power supply will generate a larger electromagnetic interference signal, and consequently some signals on a light-emitting substrate will be interfered with and deformed, causing signal errors, which will not only affect the certification of products, but also interfere with signals that control the brightness of each light-emitting sub-region, resulting in errors in brightness data of the sub-region and abnormal lighting of the sub-region, for example, in black picture display, some sub-regions are abnormally lightened due to data errors.

The light-emitting substrate includes at least one control region, the at least one control region includes a plurality of light-emitting sub-regions, and the at least one of the plurality of light-emitting sub-regions includes a plurality of light-emitting elements which are connected in series and/or in parallel. Each of the plurality of light-emitting sub-regions includes a first signal end and a second signal end, in a same control region, the first signal ends of all the light-emitting sub-regions are electrically connected with each other, and the second signal ends of the different light-emitting sub-regions are independent of each other. In some embodiments, it is explained by taking the light-emitting substrate including 1680 light-emitting sub-regions formed by 28 rows*60 columns, each driving circuit correspondingly driving 84 light-emitting sub-regions formed by 28 rows*3 columns, and so on, a total of 20 driving circuits being used in the light-emitting substrate as an example.

Figure 2:
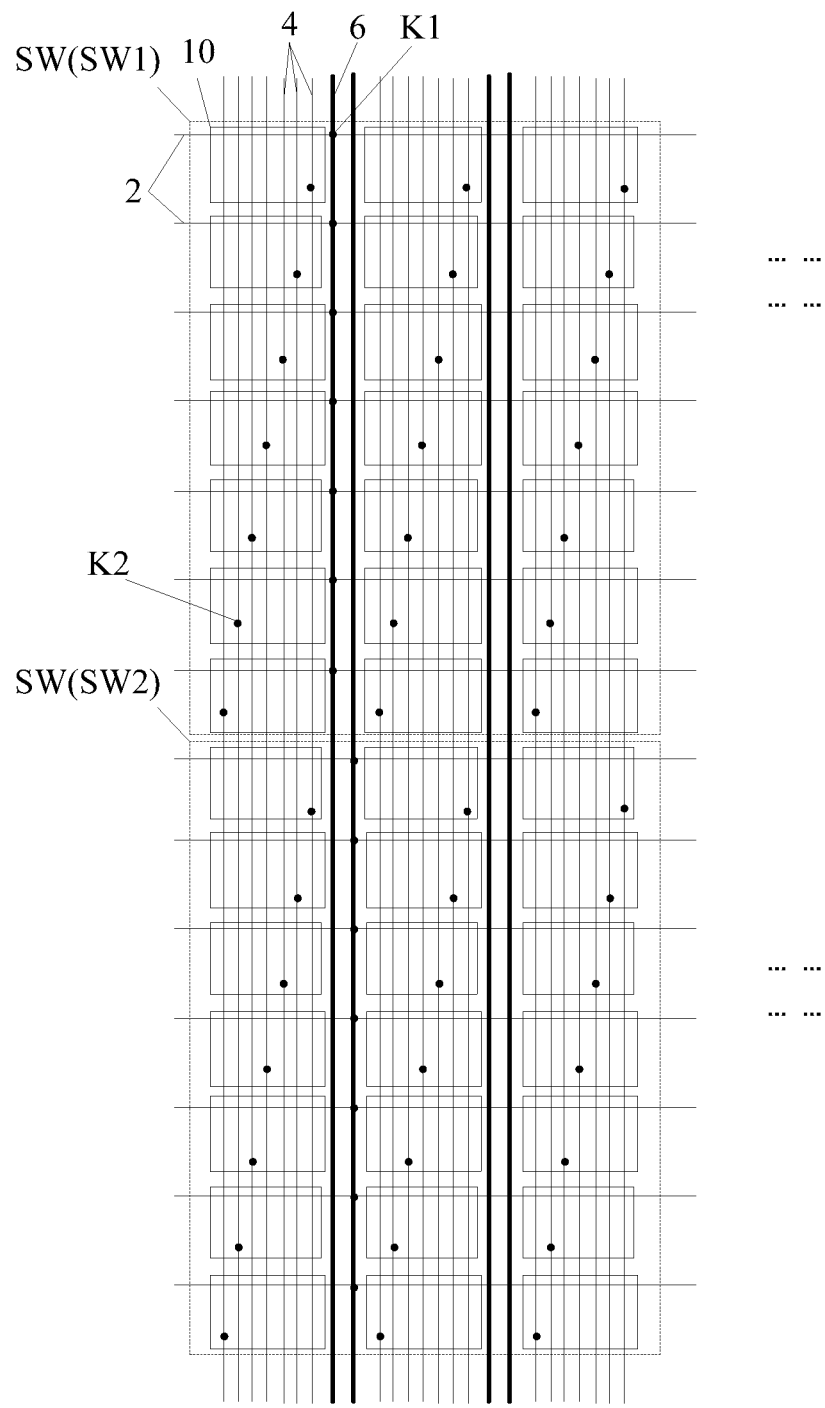
FIG. 2 is a schematic structural diagram including two control regions.
Figure 3A:
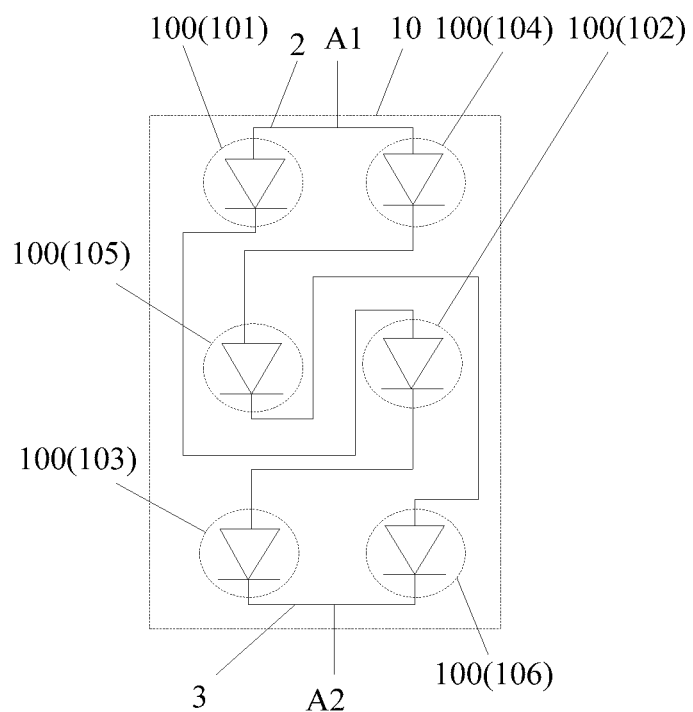
FIG. 3A is a connection schematic diagram of all light-emitting elements in each light-emitting sub-region.
Figure 3B:
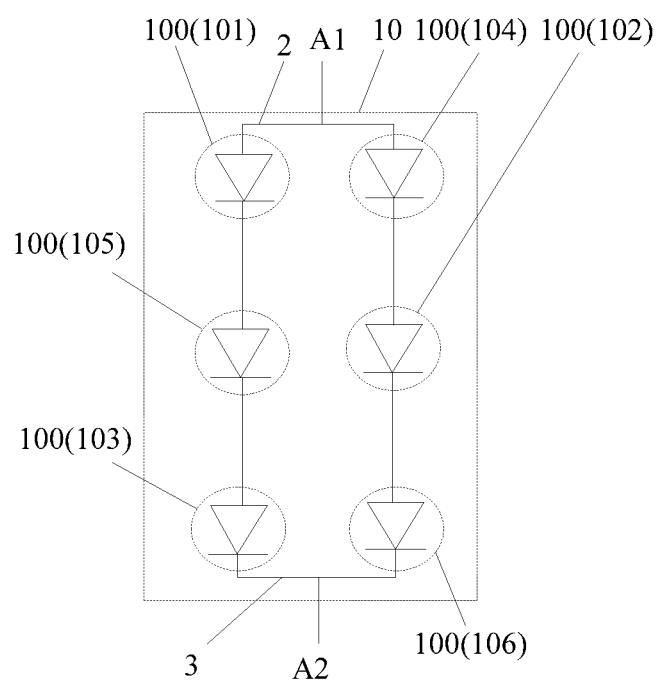
FIG. 3B is another connection schematic diagram of all light-emitting elements in each light-emitting sub-region.
Figure 3C:
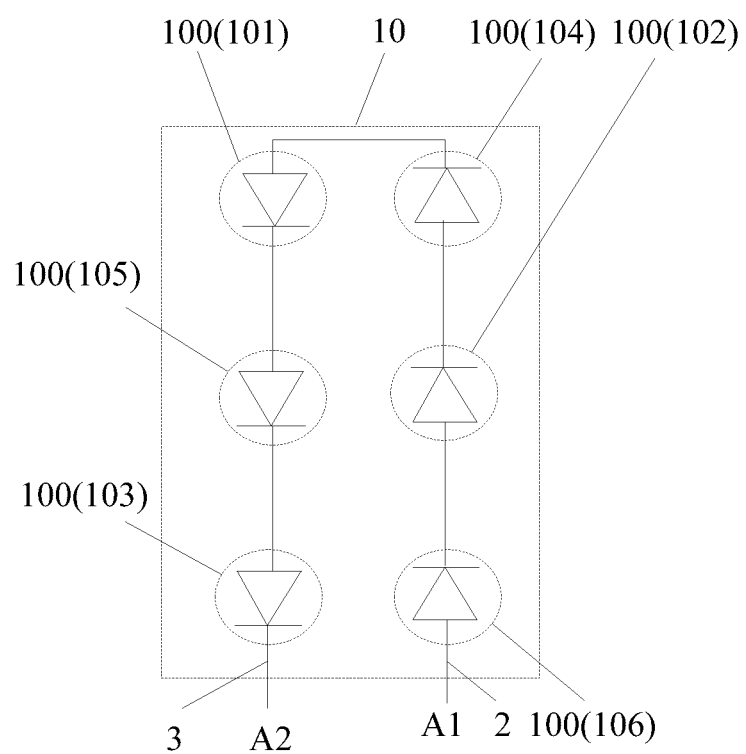
FIG. 3C is another connection schematic diagram of all light-emitting elements in each light-emitting sub-region.

In some embodiments, taking the plurality of light-emitting sub-regions correspondingly driven by one driving circuit as an example, combined with FIG. 1 to FIG. 3C, wherein FIG. 1 is a schematic diagram of four control regions SW and 84 light-emitting sub-regions 10 formed by 28 rows*3 columns correspondingly driven by one driving circuit. FIG. 2 is a local enlargement distribution schematic diagram of some control regions SW in FIG. 1. FIG. 3A is a distribution schematic diagram of all light-emitting elements in each light-emitting sub-region, including the plurality of light-emitting elements which are connected in series and in parallel. FIG. 3B is another distribution schematic diagram of light-emitting elements in each light-emitting sub-region, including the plurality of light-emitting elements which are connected in series and in parallel. FIG. 3C is another distribution schematic diagram of light-emitting elements in each light-emitting sub-region, including the plurality of light-emitting elements which are connected in series. In FIG. 1, one driving circuit 5 correspondingly drives four control regions SW, which are a first control region SW1, a second control region SW2, a third control region SW3 and a fourth control region SW4 respectively. Each control region SW includes 21 light-emitting sub-regions 10 formed by 7 rows*3 columns. Each light-emitting sub-region 10 includes a plurality of light-emitting elements 100 which are mutually connected in series and/or in parallel, for example, in FIG. 3A, each light-emitting sub-region 10 includes two light-emitting element bunches, for example, which are a first light-emitting element bunch and a second light-emitting element bunch respectively, where the first light-emitting element bunch includes a first light-emitting element 101, a second light-emitting element 102 and a third light-emitting element 103 which are successively connected in series. The second light-emitting element bunch includes a fourth light-emitting element 104, a fifth light-emitting element 105 and a sixth light-emitting element 106 which are successively connected in series. Anodes of initial light-emitting elements of the two light-emitting element bunches are electrically connected with each other to serve as a first signal end A1 of the light-emitting sub-region 10 and to be connected to a first wire routing 2. Cathodes of end light-emitting elements of the two light-emitting element bunches are electrically connected with each other to serve as a second signal end A2 of the light-emitting sub-region 10 and to be connected to a second wire routing 3. In some embodiments, the driving circuit may be a driving chip LED driver.

In the first control region SW1, the first signal ends A1 of all the light-emitting sub-regions 10 are electrically connected with each other, for example, in the same first control region SW1, the first signal ends A1 of the light-emitting sub-regions 10 of the same row are all connected to the first wire routing 2, and the first wire routing 2 of the light-emitting sub-regions 10 of the different rows are electrically connected with a third wire routing 6 through a first via hole K1, and are further electrically connected to the corresponding driving circuit 5. The second control region SW2, the third control region SW3 and the fourth control region SW4 are similar, thus, the first signal ends A1 of all the light-emitting sub-regions 10 in the same control region SW are electrically connected together, that is, the anodes of all the light-emitting elements 100 in the same control region SW are electrically connected together, and under the control of the third wire routing 6 of the corresponding driving circuit 5, the four control regions correspond to four third wire routings 6.

The second signal end A2 of each light-emitting sub-region 10 in each control region SW may be electrically connected to a fourth wire routing 4 through one corresponding second wire routing 3 through a second via hole K2, for example, in the first control region SW1, the light-emitting sub-region 10 in the first column and the last row is electrically connected to the driving circuit 5 through the first fourth wire routing 4 from the left, and the light-emitting sub-region 10 in the first column and the penultimate row is electrically connected to the driving circuit 5 through the second fourth wire routing 4 from the left and etc. Each control region SW corresponding to the same driving circuit 5, one light-emitting sub-region 10 in each control region SW is electrically connected to the driving circuit 5 through the same fourth wire routing 4, for example, the light-emitting sub-region 10 in the first column and the last row of the first control region SW1, the light-emitting sub-region 10 in the first column and the last row of the second control region SW2, the light-emitting sub-region 10 in the first column and the last row of the third control region SW3 and the light-emitting sub-region 10 in the first column and the last row of the fourth control region SW4 are all electrically connected to the same first fourth wire routing 4 from the left, thus, the second signal ends A2 of different light-emitting sub-regions 10 in the same control region are independently controlled, each control region correspoands to 21 fourth wire routings 4, and 21 corresponding channels ch1 . . . ch21 of the second signal ends A1 are formed.

Figure 4:
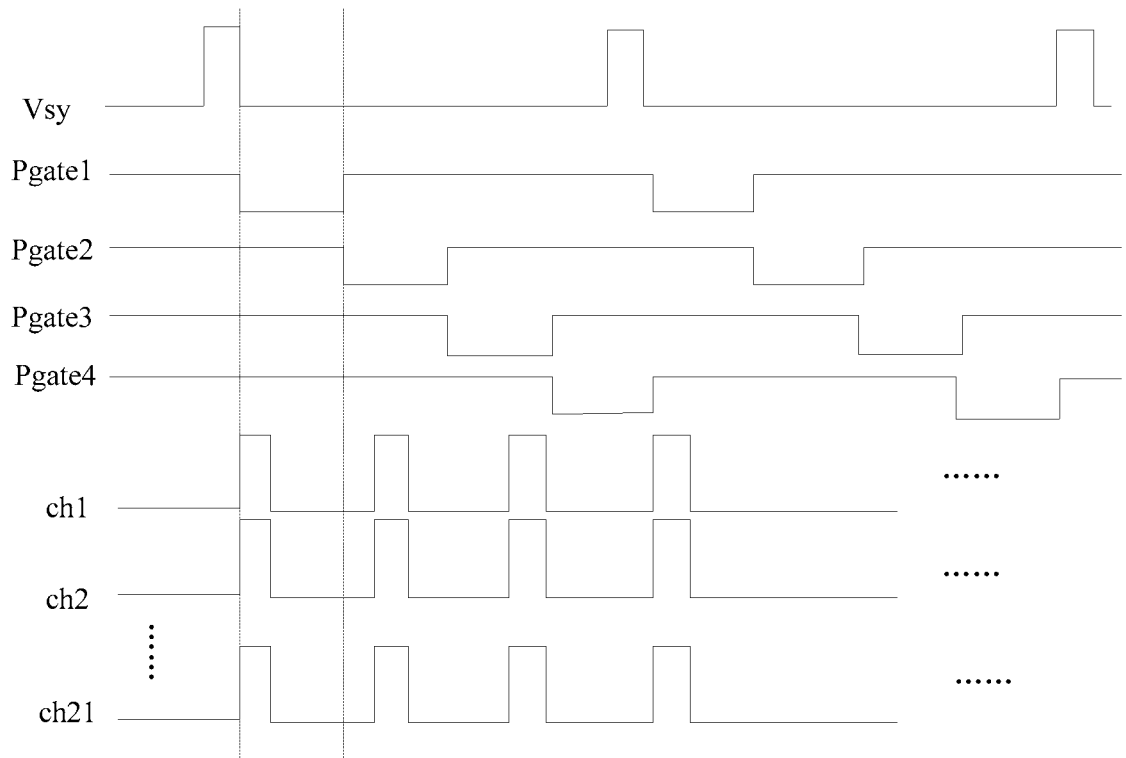
FIG. 4 is a driving schedule diagram of a light-emitting substrate in the related art.

FIG. 4 is a driving schedule diagram of a light-emitting substrate in the related art. Vsy represents a synchronization signal. Pgate1 represents a signal loaded on a first third wire routing 6 from the left, and is used for controlling signals of the first signal ends A1 of all the light-emitting sub-regions 10 in the first control region SW1. Pgate2 represents a signal loaded on a second third wire routing 6 from the left, and is used for controlling signals of the first signal ends A1 of all the light-emitting sub-regions 10 in the second control region SW2. Pgate3 represents a signal loaded on a first third wire routing 6 from the left, and is used for controlling signals of the first signal ends A1 of all the light-emitting sub-regions 10 in the third control region SW3. Pgate4 represents a signal loaded on a fourth third wire routing 6 from the left, and is used for controlling signals of the first signal ends A1 of all the light-emitting sub-regions 10 in the fourth control region SW4, and ch1 . . . ch21 represents 21 signals and successively loaded on the first fourth wire routing 4 from left to right in FIG. 1.

After a Vsy (Vsync) synchronization signal is received, low levels (low levels are valid) are successively output to the first signal end A1 of the first control region SW1, the first signal end A1 of the second control region SW2, the first signal end A1 of the third control region SW3 and the first signal end A1 of the fourth control region SW4; when signals are loaded at the first signal end A1 of each control region, ch1 . . . ch21 are simultaneously output; and when the light-emitting substrate is fully loaded, each Pgate signal is in a full time working state, at the moment, the load is the maximum, at the same time, since ch1 . . . ch21 run at the same time during the working period of each Pgate signal, which is equivalent to a full load state of all driving signals, at this time, large electromagnetic interference signals will interfere with signals that control the brightness of each light-emitting sub-region, resulting in signal errors and abnormal display.

Figure 5:
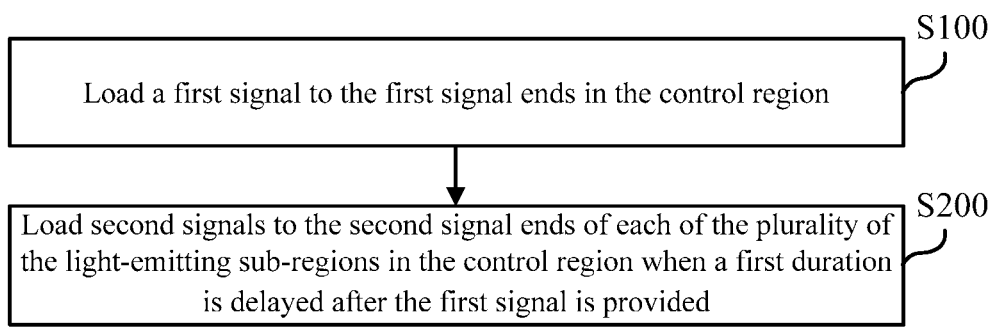
FIG. 5 is a driving process schematic diagram of a light-emitting substrate provided by an embodiment of the present disclosure.
Figure 6:
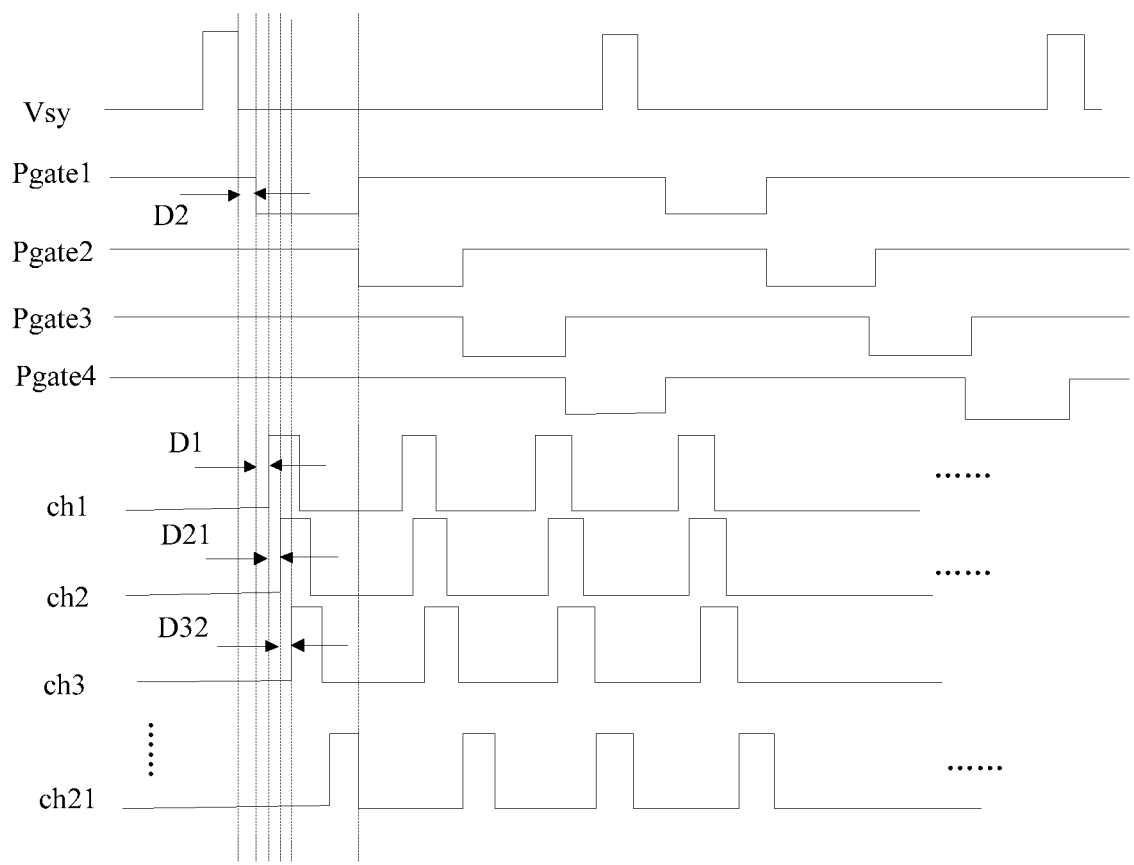
FIG. 6 is a driving schedule diagram provided by an embodiment of the present disclosure.

Accordingly, referring to FIG. 5 and FIG. 6, an embodiment of the present disclosure provides a driving method of a light-emitting substrate. Taking the light-emitting substrate shown in FIG. 1-FIG. 3A as an example, the driving method includes:

step S100, loading a first signal to the first signal ends in the control region. For example, a Pgate1 signal is loaded to a first signal end A1 of a first control region SW1; and step S200, loading second signals to the second signal ends of each of the plurality of the light-emitting sub-regions in the control region when a first duration is delayed after the first signal is provided. For example, a first duration D1 is delayed after the Pgate1 signal is provided, the second signals are loaded to second signal ends A2 of all the light-emitting sub-regions 10 in the first control region SW1, so that all the light-emitting sub-regions 10 in the first control region SW1 emit light.

In the embodiment of the present disclosure, the second signals loaded to the second signal ends of the light-emitting sub-regions in the control region are delayed by the first duration relative to the first signals loaded to the first signal ends of the light-emitting sub-regions of the control region, so that the second signals and the first signals are staggered, and the problems that at the start moment of the light-emitting substrate, the current change is relatively large, the load is relatively large, the light-emitting substrate pumps a large amount of load instantly, resulting in a large instantaneous power consumption and a large signal change, i.e. large interference, resulting in errors in brightness data of the light-emitting sub-region and abnormal lighting in the sub-region, for example, in black picture display, some light-emitting sub-regions are abnormally lightened due to data errors are solved.

It should be illustrated that the light-emitting substrate as shown in FIG. 1 to FIG. 3C includes four control regions SW, each control region includes 28 rows*3 columns light-emitting sub-regions 10. A connection mode of each light-emitting sub-region 10 and the driving circuit 5 is merely one of schematic diagrams provided by the embodiment of the present disclosure. During specific implementation, the light-emitting substrate may further include other quantities of control regions SW, each control region SW may further include other quantities or distributed light-emitting sub-regions 10, each light-emitting sub-region 10 and the driving circuit 5 may further be connected in other modes, each light-emitting sub-region 10 may further be a mode that a plurality of light-emitting elements are successively connected in series, which is not limited in the embodiment of the present disclosure, for example, the driving circuit and the light-emitting substrate may further be connected through a multiplexer MUX.

In some embodiments, in step S200, the loading the second signals to the second signal ends of all the light-emitting sub-regions in the control region, include: loading the second signals to the second signal ends of each of the light-emitting sub-regions in the control region in sequence, enable to the second signals of adjacent light-emitting sub-regions to be delayed in sequence. In some embodiments, combined with FIG. 1, FIG. 2 and FIG. 6, a first relative duration D21 is delayed after a ch1 signal is loaded to a first fourth wire routing 4 from the left in FIG. 1, and a ch2 signal is loaded to a second fourth wire routing 4 from the left in FIG. 1; and similarly, a second relative duration D32 is delayed after a ch2 signal is loaded to a second fourth wire routing 4 from the left in FIG. 1, a ch3 signal is loaded to a third fourth wire routing 4 from the left in FIG. 1, and so on, until a ch21 signal is loaded to a $21^{th}$ fourth wire routing 4 from the left in FIG. 1. In the embodiment of the present disclosure, the second signals are successively loaded to the second signal end of each light-emitting sub-region in the control region, the second signals and the first signals are staggered, meanwhile, all the second signals may further be staggered, and the problems that the light-emitting substrate pumps a large amount of load instantly, resulting in errors in brightness data of the light-emitting sub-region and abnormal lighting in the sub-region due to simultaneous loading of a plurality of signals to the light-emitting substrate are solved.

In some embodiments, delay durations of the second signals of any adjacent light-emitting sub-regions are equal. For example, a delay first relative duration D21 of a ch2 signal loaded to a second third wire routing 6 from the left in FIG. 1 relative to ch1 loaded to a first fourth wire routing 4 from the left in FIG. 1 is equal to a delay second relative duration D32 of a ch3 signal loaded to a third fourth wire routing 4 from the left in FIG. 1 relative to ch2 loaded to a second fourth wire routing 4 from the left in FIG. 1. In the embodiment of the present disclosure, second signal delay durations of any adjacent light-emitting sub-regions are equal, and each second signal is easy to generate, which is beneficial to simplifying a device structure generating the second signals.

In some embodiments, the successively loading the second signals to the second signal end of each light-emitting sub-region in the control region may include: within a start period of the first signals, the second signals are successively loaded to the second signal ends of all the light-emitting sub-regions in the control region. In some embodiments, for example, combined with FIG. 6, within the start period of loading the first signal Pgate1 to the first signal end of the first control region S1, the process of loading all the second signals (ch1 . . . ch21) to the second signal ends of all the light-emitting sub-regions in the first control region SW1 is completed. In the embodiment of the present disclosure, within the start period of the first signal, the second signals are successively loaded to the second signal ends of all the light-emitting sub-regions in the control region, so as to ensure each light-emitting sub-region in the control region to emit light.

Figure 7:
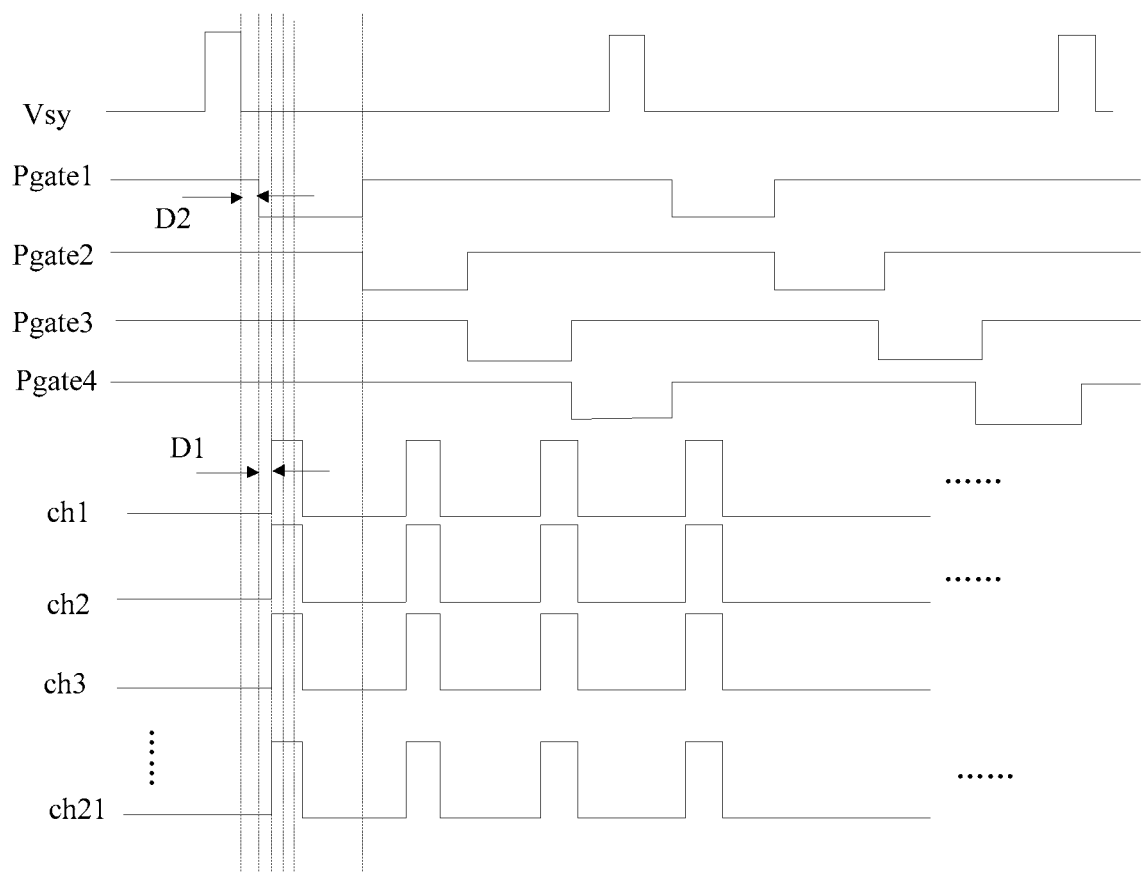
FIG. 7 is another driving schedule diagram provided by an embodiment of the present disclosure.

In some embodiments, referring to FIG. 7, the successively loading the second signals to the second signal ends of all the light-emitting sub-regions in the control region may also include: the second signals are simultaneously loaded to the second signal ends of all the light-emitting sub-regions in the control region. In some embodiments, for example, the ch2 signal is loaded to the second fourth wire routing 4 from the left in FIG. 1 while the ch1 signal is loaded to the first fourth wire routing 4 from the left in FIG. 1, and at the same time, the ch21 signal is loaded to the 21th fourth wire routing 4 from the left while the ch3 signal is loaded to the third fourth wire routing 4 from the left in FIG. 1. In the embodiment of the present disclosure, the second signals are simultaneously loaded to the second signal ends of all the light-emitting sub-regions in the control region, all the second signals may be delayed by the first duration D1 relative to the first signals, the problems of brightness data errors of the light-emitting sub-regions and abnormal lighting in the sub-regions due to simultaneous loading of a plurality of signals to the light-emitting substrate are solved, and at the same time, under the condition of an existing driving mode, less signal adjustment is carried out, and the improvement requirement on the driving circuit is reduced.

In some embodiments, the loading the first signals to the first signal ends in the control region may include: the second duration is delayed after the synchronization signal is provided, and the first signals are loaded to the first signal ends in the control region. In some embodiments, combined with FIG. 6, the second duration D2 is delayed after the synchronization signal Vsy is provided, and the first signal Pgate1 is loaded to the first signal ends in the first control region SW1.

Figure 8:
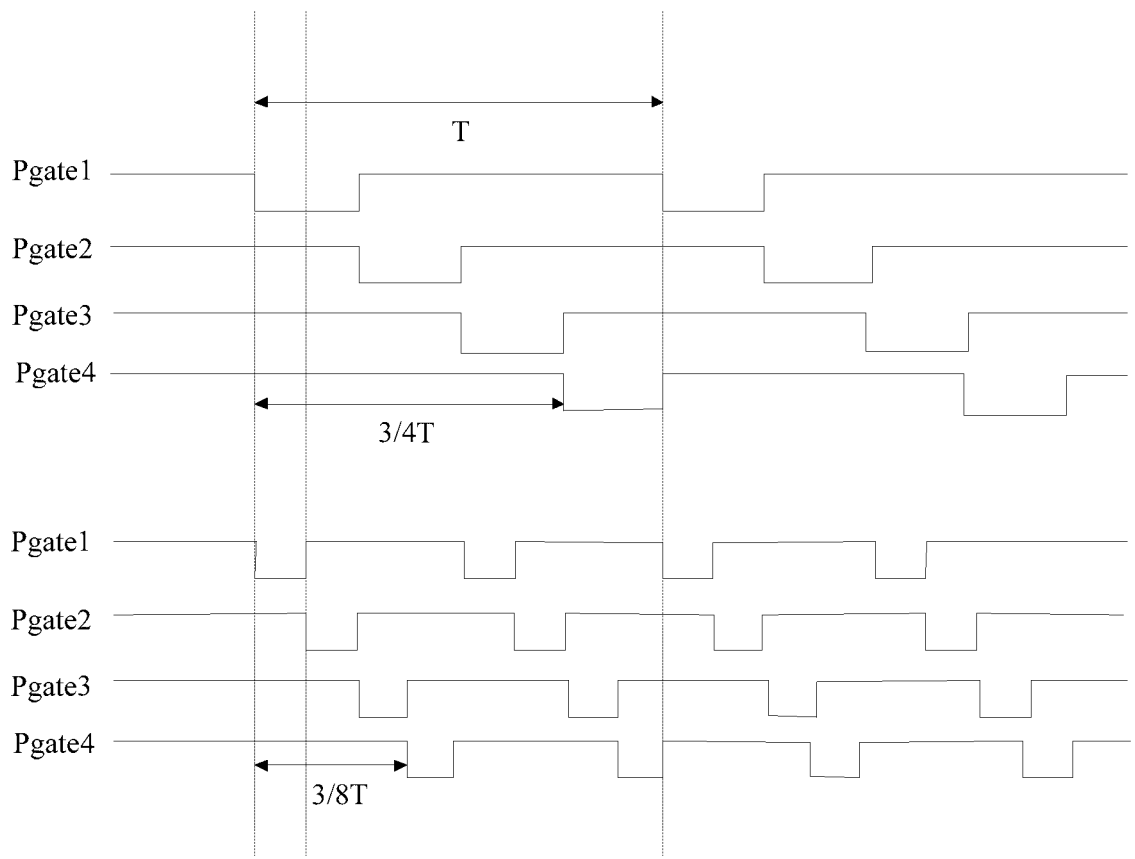
FIG. 8 is a schematic diagram of a signal loaded to a first signal end before and after frequency doubling.

In some embodiments, the loading the first signals to the first signal ends in the control region may include: the first signals are loaded to the first signal ends in the control region at a driving frequency of 15 MHZ to 25 MHZ. In the related art, signals are loaded to the first signal ends in the control region generally at a driving frequency of 10 MHZ, In some embodiments, in the embodiment of the present disclosure, signals may be loaded to the first signal ends in the control region at a driving frequency of 20 MHZ, that is, relative to the related art, according to the embodiment of the present disclosure, the signals loaded to the first signal ends in the control region are doubled, and therefore, the influence on backlight due to delay may be reduced. In some embodiments, combined with FIG. 8, in FIG. 8, the four groups of signals above are signals loaded to the first signal ends of each control region before adjustment, the four groups of signals below are signals loaded to the first signal ends of each control region after adjustment, wherein, the four groups of signals below are doubled at frequency relative to the four groups of signals above, a signal loading period of the first signal ends of each control region is T, a delay duration of the signal loaded to the first signal ends of the fourth control region SW4 relative to the signal loaded to the first signal ends of the first control region SW1 is reduced to ⅜ T from ¾ T, and the integral duration of the light-emitting substrate will not be increased excessively.

In some embodiments, the driving method may further include: when it is determined that the first signals at the first signal ends of the current control region are finished, third signals are provided for first signal ends of the next control region. In some embodiments, combined with FIG. 6, when it is determined that the first signal Pgate1 of the first signal ends of the first control region SW1 is finished, the third signal Pgate2 is provided for the first signal ends of the second control region SW2, similarly, when it is determined that the third signal Pgate2 of the first signal ends of the second control region SW2 is finished, a fourth signal Pgate3 is provided for the first signal ends of the third control region SW3, when it is determined that the fourth signal Pgate3 of the first signal ends of the third control region SW3 is finished, a fifth signal Pgate4 is provided for the first signal ends of the fourth control region SW4, that is, all the control regions are successively opened to successively emit light.

Based on the same inventive concept, an embodiment of the present disclosure further provides a driving circuit, including:
 a first module, configured to load a first signal to the first signal ends in the control region; and
 a second module, configured to load second signals to the second signal ends of each of the plurality of the light-emitting sub-regions in the control region when a first duration is delayed after the first signal is provided.

In some embodiments, the first module is further configured to load the second signals to the second signal ends of each of the light-emitting sub-regions in the control region in sequence, enable to the second signals of adjacent light-emitting sub-regions to be delayed in sequence.

In some embodiments, the first module is further configured to load the second signals to the second signal ends of each of the light-emitting sub-regions in the control region simultaneously.

In some embodiments, the first module is further configured to load the first signal to the first signal ends in the control region, when a second duration is delayed after a synchronization signal is provided.

In some embodiments, the first module is further configured to load the first signal to the first signal ends in the control region at a driving frequency of 15 MHZ to 25 MHZ.

In some embodiments, the driving circuit further includes a third module, and the third module is configured to provide third signal to first signal ends of a next control region when it is determined that the first signal of the first signal ends of the current control region is turn off.

Based on the same inventive concept, an embodiment of the present disclosure further provides a display apparatus, including the at least one driving circuit provided by the embodiment of the present disclosure and a light-emitting substrate, the light-emitting substrate includes: at least one control region, the at least one control region includes a plurality of light-emitting sub-regions, and the at least one of the plurality of light-emitting sub-regions includes a plurality of light-emitting elements which are connected in series and/or in parallel; each of the plurality of light-emitting sub-regions includes a first signal end and a second signal end, in a same control region, the first signal ends of all the light-emitting sub-regions are electrically connected with each other, and the second signal ends of the different light-emitting sub-regions are independent of each other.

In some embodiments, the driving circuit is a light-emitting control chip LED Driver.

In the embodiment of the present disclosure, the second signals loaded to the second signal ends of the light-emitting sub-regions in the control region are delayed by the first duration relative to the first signals loaded to the first signal ends of the light-emitting sub-regions of the control region, so that the second signals and the first signals are staggered, and the problems that at the start moment of the light-emitting substrate, the current change is relatively large, the load is relatively large, the light-emitting substrate pumps a large amount of load instantly, resulting in a large instantaneous power consumption and a large signal change, i.e. large interference, resulting in errors in brightness data of the light-emitting sub-regions and abnormal lighting in the sub-region, for example, in black picture display, some light-emitting sub-regions are abnormally lightened due to data errors are solved.

Although the preferred embodiments of the present disclosure are described, additional changes and modifications may be made to these embodiments once the basic creative concepts are known to those skilled in the art. Therefore, the attached claims are intended to include the preferred embodiments and all changes and modifications falling within the scope of the present disclosure.

It will be apparent to those skilled in the art that various changes and modifications may be made to the embodiments of the present disclosure without departing from the spirit or scope of the embodiments of the present disclosure. In this way, if these changes and modifications of the embodiments of the present disclosure fall within the scope of the claims of the present disclosure and their equivalent art, the present disclosure also intends to include these changes and modifications.

What is claimed is:

1. A method for driving a light-emitting substrate, wherein the light-emitting substrate comprises: at least one control region, the at least one control region comprises a plurality of light-emitting sub-regions, and the at least one of the plurality of light-emitting sub-regions comprises a plurality of light-emitting elements which are connected in series and/or in parallel; each of the plurality of light-emitting sub-regions comprises a first signal end and a second signal end; in a same light-emitting sub-region, the plurality of light-emitting elements are connected in series and/or in parallel and then connected to the first signal end and the second signal end; in a same control region, the first signal ends of all the light-emitting sub-regions are electrically connected with each other, and the second signal ends of the different light-emitting sub-regions are independent of each other;
 wherein the method comprises:
 loading a first signal to the first signal ends in the control region; and
 loading second signals to the second signal ends of each of the plurality of the light-emitting sub-regions in the control region when a first duration is delayed after the first signal is provided.

2. The method according to claim 1, wherein, the loading the second signals to the second signal ends of each of the plurality of the light-emitting sub-regions in the control region, comprises:
 loading the second signals to the second signal ends of each of the light-emitting sub-regions in the control region in sequence, enable to the second signals of adjacent light-emitting sub-regions to be delayed in sequence.

3. The method according to claim 2, wherein, delay durations of the second signals of any adjacent light-emitting sub-regions are equal.

4. The method according to claim 2, wherein, the loading the second signals to the second signal ends of each of the light-emitting sub-regions in the control region in sequence, comprises:
 loading, during a loading period of the first signals, the second signals to the second signal ends of each of the light-emitting sub-regions in the control region in sequence.

5. The method according to claim 1, wherein, the loading the second signals to the second signal ends of each of the light-emitting sub-regions in the control region in sequence, comprises:

loading the second signals to the second signal ends of each of the light-emitting sub-regions in the control region simultaneously.

6. The method according to claim 1, wherein, the loading the first signal to the first signal ends in the control region, comprises:
loading the first signal to the first signal ends in the control region, when a second duration is delayed after a synchronization signal is provided.

7. The method according to claim 1, wherein, the loading the first signal to the first signal ends in the control region, comprises:
loading the first signal to the first signal ends in the control region at a driving frequency of 15 MHZ to 25 MHZ.

8. The method according to claim 1, further comprising:
providing a third signal to first signal ends of a next control region when it is determined that the first signal of the first signal ends of the current control region is turned off.

9. A driving circuit for driving a light-emitting substrate, wherein the light-emitting substrate comprises: at least one control region, the at least one control region comprises a plurality of light-emitting sub-regions, and the at least one of the plurality of light-emitting sub-regions comprises a plurality of light-emitting elements which are connected in series and/or in parallel; each of the plurality of light-emitting sub-regions comprises a first signal end and a second signal end; in a same light-emitting sub-region, the plurality of light-emitting elements are connected in series and/or in parallel and then connected to the first signal end and the second signal end; in a same control region, the first signal ends of all the light-emitting sub-regions are electrically connected with each other, and the second signal ends of the different light-emitting sub-regions are independent of each other;
wherein the driving circuit comprises:
a first module, configured to load a first signal to the first signal ends in the control region; and
a second module, configured to load second signals to the second signal ends of each of the plurality of the light-emitting sub-regions in the control region when a first duration is delayed after the first signal is provided.

10. The driving circuit according to claim 9, wherein, the first module is further configured to load the second signals to the second signal ends of each of the light-emitting sub-regions in the control region in sequence, enable to the second signals of adjacent light-emitting sub-regions to be delayed in sequence.

11. The driving circuit according to claim 9, wherein, the first module is further configured to load the second signals to the second signal ends of each of the light-emitting sub-regions in the control region simultaneously.

12. The driving circuit according to claim 9, wherein, the first module is further configured to load the first signal to the first signal ends in the control region, when a second duration is delayed after a synchronization signal is provided.

13. The driving circuit according to claim 9, wherein, the first module is further configured to load the first signal to the first signal ends in the control region at a driving frequency of 15 MHZ to 25 MHZ.

14. The driving circuit according to claim 9, further comprising a third module, wherein the third module is configured to provide a third signal to first signal ends of a next control region when it is determined that the first signal of the first signal ends of the current control region is turned off.

15. A display apparatus, comprising at least one driving circuit according to claim 9, and further comprising a light-emitting substrate, wherein the light-emitting substrate comprises: at least one control region, the at least one control region comprises a plurality of light-emitting sub-regions, and the at least one of the plurality of light-emitting sub-regions comprises a plurality of light-emitting elements which are connected in series and/or in parallel; each of the plurality of light-emitting sub-regions comprises a first signal end and a second signal end, in a same control region, the first signal ends of all the light-emitting sub-regions are electrically connected with each other, and the second signal ends of the different light-emitting sub-regions are independent of each other.

16. The display apparatus according to claim 15, wherein the driving circuit is a light-emitting control chip.

17. The display apparatus according to claim 15, wherein, the first module is further configured to load the second signals to the second signal ends of each of the light-emitting sub-regions in the control region in sequence, enable to the second signals of adjacent light-emitting sub-regions to be delayed in sequence.

18. The display apparatus according to claim 15, wherein, the first module is further configured to load the second signals to the second signal ends of each of the light-emitting sub-regions in the control region simultaneously.

19. The display apparatus according to claim 15, wherein, the first module is further configured to load the first signal to the first signal ends in the control region, when a second duration is delayed after a synchronization signal is provided.

20. The display apparatus according to claim 15, wherein, the first module is further configured to load the first signal to the first signal ends in the control region at a driving frequency of 15 MHZ to 25 MHZ.

* * * * *